United States Patent [19]
Bloemen

[11] Patent Number: 4,700,130
[45] Date of Patent: Oct. 13, 1987

[54] CURRENT-MEASURING ARRANGEMENT WITH OVERLOAD PROTECTION

[75] Inventor: Hendrikus F. B. Bloemen, Almelo, Netherlands

[73] Assignee: U.S. Philips Corporation, New York, N.Y.

[21] Appl. No.: 235,218

[22] Filed: Feb. 17, 1981

[30] Foreign Application Priority Data

Mar. 12, 1980 [NL] Netherlands ............... 8001452

[51] Int. Cl.$^4$ .................................. G01R 1/36
[52] U.S. Cl. .................... 324/110; 307/200 A; 338/22 R
[58] Field of Search .......... 324/110; 338/22 R; 361/106; 307/200 A, 542, 546; 328/175

[56] References Cited
PUBLICATIONS

Smith, C. G.; "Application of Positive ..."; Electronic Equipment News; vol. 12; No. 12; Mar. 1971; pp. 42–49.

Primary Examiner—Ernest F. Karlsen
Attorney, Agent, or Firm—Robert T. Mayer; Bernard Franzblau

[57] ABSTRACT

A current measuring arrangement including a measuring resistor can be protected against excess currents by means of a PTC-resistor and an amplifier circuit. This protection is self-restoring in contrast to the conventional series-connected safety fuse. The amplifier circuit, the PTC-resistor and the measuring resistor may be arranged so that the property of zero voltage drop of a known circuit arrangement is maintained.

15 Claims, 4 Drawing Figures

CURRENT-MEASURING ARRANGEMENT WITH OVERLOAD PROTECTION

The invention relates to a current-measuring arrangement with overload protection comprising two input terminals for the current, a measuring resistor across which the current to be measured produces a voltage drop such that on two output terminals of the arrangement a voltage is available as a measure of the current. A circuit breaker is connected in series with the measuring resistor and changes from a low-resistance to a high-resistance condition in the case of excessive currents.

It is known to protect current measurement ranges in measuring instruments by including a safety fuse in series with the range. If the current becomes excessive, for example because too high a voltage is applied to the current input terminals, the safety fuse melts thereby preventing the measuring resistor in the selected current measurement range from being overheated or damaged.

A disadvantage is that replacing the blown fuse by a new safety fuse is frequently a laborious procedure and that spare fuses must be kept in stock and be readily at hand. Furthermore, switching contacts in the circuit may be damaged by the excessive current surge which is produced at a high voltage and before the safety fuse melts.

From the article "Characteristics and Applications of PTC-thermistors" in "Electro-technology" of July 1962, pages 96 to 99, specifically FIG. 8 on page 99, it is known to include PTC-resistors in series with a load. The PTC resistor changes from a comparatively low-resistance to a high-resistance condition when the load becomes so high that excess currents would be developed in the circuit, thereby limiting the maximum possible current in the circuit.

The invention utilizes this idea in a current measuring circuit, which is therefore characterized in that the circuit breaker is a PTC-resistor, i.e. a resistor with a positive temperature coefficient, which is included in a negative feedback circuit between one input terminal and one output terminal of an operational amplifier. The other input terminal and the other output terminal of the amplifier are connected to one output terminal of the current measuring circuit and the one input terminal of the amplifier is connected to one input terminal of the current measuring circuit.

Since, under normal conditions, i.e. when their own temperature is low within the ambient temperature range, the PTC resistors to be used have a comparatively high resistance relative to the resistance of a safety fuse, the invention employs an operational amplifier in order to obtain a substantial reduction in the influence of this high resistance. Thus, a self-restoring protection device for the current ranges of measuring instruments is obtained which, within a few seconds after the excess current has ceased, enables the instrument to again accurately measure an applied current within the measurement range, although it has been actuated in order to protect the measuring circuit against the excess current.

In an embodiment of the invention the safety fuse may be directly replaced by the circuit comprising the amplifier and PTC resistor. To this end this embodiment is characterized in that the other input terminal and the other output terminal of the current measuring arrangement are connected to the one end of the measuring resistor, the other end of said resistor being connected to the other output terminal of the amplifier.

It is alternatively possible to include the measuring resistor in series with the PTC-resistor in the negative feedback circuit of the amplifier. This embodiment is characterized in that the other input terminal of the arrangement is connected to the other output terminal of the amplifier and the other output terminal of the arrangement is connected to the junction of the PTC resistor and the measuring resistor, the other end of which is connected to the one input terminal of the amplifier.

This current measuring arrangement has the additional advantage that, owing to the amplifier, the voltage drop across the arrangement input terminals is substantially zero. This idea is known per se from the magazine "ATM, Archiv für Technics Messen", Volume Z6343-9 (July 1973), page 137, FIG. 1.

Moreover, the measuring arrangement may be provided with zener diodes connected in series opposition for diverting high voltages, while the input of the amplifier may be protected by two anti-parallel diodes provided with a series-connected limiting resistor.

The invention will now be described in more detail with reference to the drawing, in which.

Figure 1:
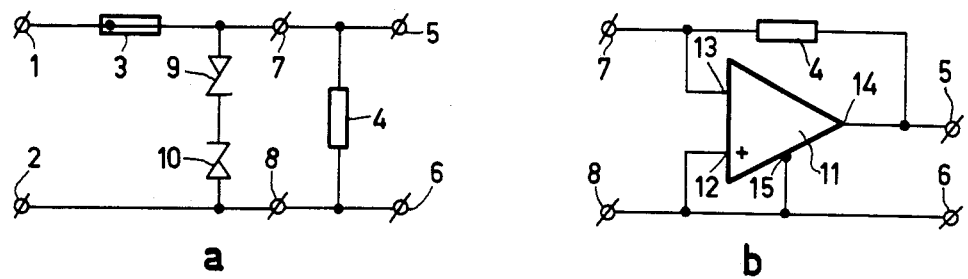
FIGS. 1a and 1b show known current measuring circuits.

FIG. 1a shows a known current measuring circuit, the current to be measured being applied to the input terminals 1 and 2. The current, after having passed the safety fuse 3, produces a voltage drop across the measuring resistor 4, which voltage drop can be measured across output terminals 5 and 6 as a measure of the current. The measuring resistor 4 is arranged so that the terminals 7 and 8 serve as the current input and the terminals 5 and 6 as the output for the measuring voltage. Two zener diodes 9 and 10, connected in series opposition, are included between the terminals 7 and 8 in order to limit the voltage, which in the case of an excess current, will be produced across the measuring resistor 4 before the safety fuse 3 blows.

In FIG. 1b the measuring resistor 4 is included in the negative-feedback circuit of an amplifier 11. The one input terminal 12 is connected to the connecting line between the terminals 6 and 8, the other input terminal 13 is connected to the terminal 7 and to the measuring resistor 4, which is also connected to the output 14 of amplifier 11 and to the output terminal 5. The amplifier ensures that the input current of the measuring circuit flows through the resistor 4, the voltage across the terminals 7 and 8, and thus across the input terminals 1 and 2 in FIG. 1a, being substantially zero.

Figure 2:
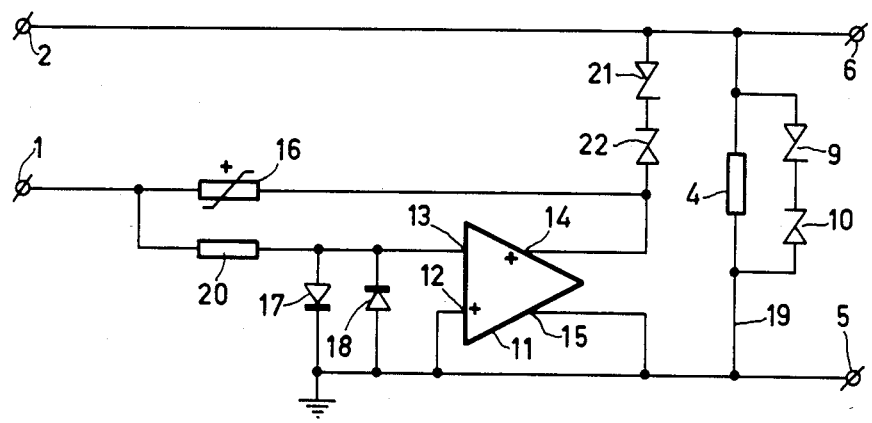
FIG. 2 shows a first embodiment of the invention.

In FIG. 2 the safety fuse has been replaced by an amplifier with a PTC-resistor. The amplifier is represented by the same reference numerals as used in FIG. 1b.

In the negative feedback circuit of the amplifier 11 the PTC-resistor 16 is included between the input terminal 13 and the output terminal 14. In order to protect the inputs at the terminals 12 and 13, two diodes 17 and 18 arranged in anti-parallel are included. The input terminal 12 is connected to ground, to one end 19 of the measuring resistor 4 and to the output terminal 5. The input terminal 13 is connected to an input terminal 1 and to the PTC-resistor 16 via a high-ohmic resistor 20. Said resistor 20 reduces a high voltage which may occur between terminal 1 and ground, but under normal conditions will not affect the operation of the amplifier 11, so that in fact the current to be measured via input terminal 1 first passes through the resistor 16 and then through the output terminals 14 and 15, leaving the circuit again via measuring resistor 4 and the other input terminal 2 of the circuit.

The potential of input terminal 12 is equal to the potential of input terminal 13 and thus to the potential of input terminal 1, so that input terminal 1, the end 19 of resistor 4 and output terminal 5 are at substantially the same potential. As a further protection the zener diodes 21 and 22 have been included in addition to the zener diodes 9 and 10 across measuring resistor 4.

A normal current within the measurement range will develop a low voltage across the resistor 16 so that little heat is produced. The temperature of the resistor will then be slightly higher than the ambient temperature. If the current increases, the temperature of the resistor may reach a so-called switching temperature, above which the resistance becomes several factors higher within a small temperature range, for example one hundred times or one thousand times higher. Thus, depending on the open voltage of the source of high voltage in the measuring circuit together with the series resistance herein, a balanced condition will be obtained with the resistance of the PTC resistor remaining high at a comparatively small current owing to the heat which is developed.

When in the case of overloading the voltage across the PTC resistor reaches the drive voltage of the output stages in the amplifier, negative feedback around the amplifier is no longer possible and its input voltage is liable to become too high. In order to avoid this, two anti-parallel diodes 17 and 18 are included between input terminals 12 and 13 and the measuring voltage for the amplifier is applied to the terminal 13 via a resistor 20. The maximum voltage at the input of the amplifier is therefore equal to the forward diode voltage. As, in a similar fashion to the known circuit arrangement of FIG. 1a, when a high voltage is applied to input terminals 1 and 2 said voltage may appear briefly at the output terminals 5 and 6, the zener diodes 9 and 10 may be included across the resistor 4 in the same way as in FIG. 1a. These do not however protect the amplifier 11. For this purpose two zener diodes 21 and 22 in series opposition are included between the output terminal 14 and the input terminal 2. These zener diodes ensure that the voltage across the terminals 5 and 6 in series with the output voltage across the terminals 14 and 15 cannot exceed the zener voltage, and moreover the current through the circuit cannot become so large that the output of the amplifier 11 could no longer supply this current. Dimensioning the zener diodes 21 and 22 in this way, generally it will not be necessary to include the zener diodes 9 and 10. It is also advantageous that a high voltage appears directly across the PTC resistor 16 via the zener diodes so that a large current can flow which rapidly heats the resistor.

Figure 3:
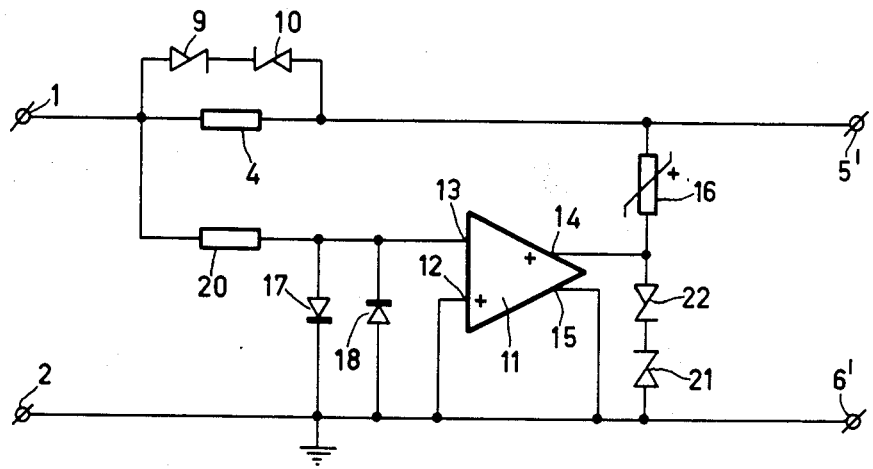
FIG. 3 shows a second embodiment of the invention.

FIG. 3 shows a current measuring circuit which is based on the known diagram of FIG. 1b. The excess current protection in accordance with the invention is obtained by including the PTC-resistor in the negative feedback circuit between output terminal 14 and output terminal 5'. Also in this case there is provided a series arrangement for carrying the current, which series arrangement comprises the measuring resistor 4, as the case may be together with the zener diodes 9 and 10, subsequently the PTC-resistor 16, and the output 14, 15 of amplifier 11, as the case may be shunted by zener diodes 21 and 22. Up to the maximum drive of the amplifier 11 the circuit will be capable of measuring the input current because the voltage across the terminals 1 and 2 is maintained at zero by means of the amplifier. Thus, the measuring voltage across resistor 4 is available across the terminals 5' and 6'. The current to be measured produces a voltage across the resistor 16 which is equal to the voltage of opposite sign supplied by the amplifier at output 14, 15 minus the measuring voltage. The switching temperature of the PTC-resistor may have been exceeded already before the maximum drive of the amplifier is reached. Small current increases may then give rise to large voltage variations, so that the amplifier is turned off and the zener diodes 21 and 22 are turned on. Also in the case of the erroneous application of a high voltage, such as the supply voltage, to the input terminals 1 and 2, a large surge current will flow through the zener diodes 9 and 10, the resistor 16 and the zener diodes 21 and 22 until the temperature of the resistor 16 has become so high that the switching temperature is exceeded and the current is, for example, limited to one thousandth of the value it would otherwise have. The measuring circuit, which is connected to the output terminals 5' and 6', can simply be protected, in a similar way to the amplifier 11, against the high voltage produced across the resistor 16. This measuring circuit can detect this overload condition as such and signal the fact, which need not be the case in the current measuring circuit of FIG. 2.

What is claimed is:

1. A current measuring arrangement with overload protection comprising, a measuring resistor across which a voltage drop is produced by the current to be measured, two input terminals for the current to be measured, an operational amplifier having two input terminals and two output terminals, a PTC resistor having a positive temperature coefficient such that it changes from a low resistance to a high resistance state in the event of an excessive current, two output terminals of the arrangement coupled to the measuring resistor so that a voltage is available at said output terminals determined by said voltage drop and thereby providing a measure of the current, means connecting the PTC resistor in a negative feedback circuit of the operational amplifier between one amplifier input terminal and one amplifier output terminal, means connecting the other input terminal and the other output terminal of the amplifier to one output terminal of the current measuring arrangement, means connecting the one input terminal of the amplifier to one input terminal of the current measuring arrangement, and means coupling the other input terminal of the arrangement to one of said output terminals of the arrangement.

2. A current measuring arrangement as claimed in claim 1 further comprising means connecting the measuring resistor between said two output terminals of the arrangement, and wherein said means couples the other input terminal to the other output terminal of the current measuring arrangement.

3. A current measuring arrangement as claimed in claim 1 wherein the other input terminal of the arrangement is connected to the other output terminal of the amplifier, and the other output terminal of the arrangement is connected to a junction of the PTC-resistor and the measuring resistor, and means connecting the other end of the measuring resistor to the one input terminal of the amplifier.

4. A current measuring arrangement as claimed in claim 2 or 3, further comprising two zener diodes connected in series opposition between the one output terminal of the amplifier and the other input terminal of the current measuring arrangement, two anti-parallel diodes connected between the two input terminals of the amplifier, and wherein the one input terminal of the amplifier is connected to the one input terminal of the current measuring arrangement via a resistor.

5. A current measuring apparatus with overload protection comprising, first and second current terminals for the current to be measured, a measuring resistor, an amplifier having two input terminals and two output terminals, a PTC resistor having a positive temperature coefficient so that it changes from a low resistance state to a high resistance state for currents above a given value, first and second output terminals coupled to the measuring resistor so that a voltage is developed at said output terminals indicative of the value of the current being measured, first means connecting the first output terminal to the first current terminal, second means connecting the PTC resistor in a negative feedback circuit of the amplifier between one of said amplifier output terminals and one of said amplifier input terminals, third means connecting said one input terminal of the amplifier to the second current terminal, and fourth means connecting the other amplifier input terminal and the other amplifier output terminal to one of said output terminals.

6. An apparatus as claimed in claim 5 wherein said fourth connecting means connects said other input and output terminals of the amplifier to said second output terminal so that a current flows from a first to a second current terminal via a series circuit including the measuring resistor, the two output terminals of the amplifier and the PTC resistor.

7. An apparatus as claimed in claim 5 wherein said amplifier comprises an operational amplifier and further comprising, two Zener diodes connected in series opposition between said one amplifier output terminal and said first current terminal.

8. An apparatus as claimed in claim 5 wherein said amplifier comprises an operational amplifier and further comprising, two diodes connected in anti-parallel across the two input terminals of the operational amplifier, and wherein said third connecting means includes a resistor for connecting said one amplifier input terminal to the second current terminal via a current path exclusive of the PTC resistor.

9. An apparatus as claimed in claim 5 wherein the measuring resistor is connected across said first and second output terminals of the apparatus.

10. An apparatus as claimed in claim 9 wherein said amplifier comprises an operational amplifier and said fourth connecting means connects said amplifier other input and other output terminals to said second output terminal so that the potential at the second current terminal is equal to the potential at the second output terminal of the apparatus.

11. A current measuring apparatus with overload protection comprising, first and second current terminals for the current to be measured, a measuring resistor, an amplifier having two input terminals and two output terminals, a PTC resistor having a positive temperature coefficient so that it changes from a low resistance state to a high resistance state for currents above a given level, first and second output terminals with the measuring resistor connected between the second current terminal and the second output terminal, first means connecting the first output terminal to the first current terminal, second means connecting the PTC resistor in a negative feedback circuit of the amplifier between one of said amplifier output terminals and one of said amplifier input terminals, third means connecting said one input terminal of the amplifier to the second current terminal, and fourth means connecting the other amplifier input terminal and the other amplifier output terminal to said first output terminal.

12. An apparatus as claimed in claim 11 wherein the second connecting means connects the PTC resistor and the measuring resistor in series in said negative feedback circuit with the measuring resistor connected to the second current terminal and the second output terminal connected to a junction between the PTC resistor and the measuring resistor.

13. An apparatus as claimed in claim 11 wherein the second connecting means connects the PTC resistor and the measuring resistor in series in said negative feedback circuit with the measuring resistor connected to the second current terminal so that a current flows from a first to a second current terminal via a series circuit including the measuring resistor, the two output terminals of the amplifier and the PTC resistor.

14. An apparatus as claimed in claim 11 wherein said amplifier comprises an operational amplifier and further comprising, two Zener diodes connected in series opposition between said one amplifier output terminal and said first current terminal.

15. An apparatus as claimed in claim 11 wherein said amplifier comprises an operational amplifier and further comprising, two diodes connected in anti-parallel across the two input terminals of the operational amplifier, and wherein said third connecting means includes a resistor for connecting said one amplifier input terminal to the second current terminal via a current path exclusive of the PTC resistor.

* * * * *